(12) United States Patent
Feng et al.

(10) Patent No.: US 9,059,204 B2
(45) Date of Patent: Jun. 16, 2015

(54) METHODOLOGY AND APPARATUS FOR TUNING DRIVING CURRENT OF SEMICONDUCTOR TRANSISTORS

(71) Applicant: International Business Machines Corporation, Armonk, NY (US)

(72) Inventors: Kai D. Feng, Hopewell Junction, NY (US); J. Edwin Hostetter, Jr., Pleasant Valley, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/263,067

(22) Filed: Apr. 28, 2014

(65) Prior Publication Data
US 2014/0234990 A1    Aug. 21, 2014

Related U.S. Application Data

(62) Division of application No. 13/280,666, filed on Oct. 25, 2011, now Pat. No. 8,779,838.

(51) Int. Cl.
| | |
|---|---|
| *H01L 21/02* | (2006.01) |
| *H01L 29/66* | (2006.01) |
| *H01L 21/326* | (2006.01) |
| *G01R 31/27* | (2006.01) |
| *H01L 29/78* | (2006.01) |

(52) U.S. Cl.
CPC ........ *H01L 29/66477* (2013.01); *G01R 31/275* (2013.01); *H01L 21/326* (2013.01); *H01L 29/7833* (2013.01)

(58) Field of Classification Search
CPC .................. H01L 29/66477; H01L 21/02
USPC ......... 327/427, 434, 538, 543, 403, 404, 374, 327/378, 382, 383, 389, 333
See application file for complete search history.

(56) References Cited

U.S. PATENT DOCUMENTS

| | | | |
|---|---|---|---|
| 5,103,116 | A | 4/1992 | Sivilotti et al. |
| 6,804,136 | B2 | 10/2004 | Forbes |
| 7,224,208 | B2 | 5/2007 | Matsushita |

(Continued)

FOREIGN PATENT DOCUMENTS

| | | |
|---|---|---|
| CN | 103891144 A | 6/2014 |
| WO | 2013063058 A1 | 5/2013 |

OTHER PUBLICATIONS

Yang et al. Hot Carrier Reliability of High-Speed SiGe HBT's under Accelerated Collector-Base Avalanche Bias, Proceedings of the 7th International Caribbean Conference on Devices, Circuits and Systems, Mexico, Apr. 28-30, 2008, pp. 1-7.

(Continued)

*Primary Examiner* — Jung Kim
(74) *Attorney, Agent, or Firm* — Parthiban A. Mathavan; William H. Steinberg (57) ABSTRACT

A method and apparatus for repairing transistors may include applying a first voltage to a source, a second voltage to the gate and a third voltage to the drain for a predetermined time. In this manner the transistor structure may be repaired or returned to operate at or near the original operating characteristics.

9 Claims, 10 Drawing Sheets

(56) References Cited

U.S. PATENT DOCUMENTS

| | | |
|---|---|---|
| 7,598,761 B2 | 10/2009 | Yasuda |
| 7,655,099 B2 | 2/2010 | Lee et al. |
| 7,843,024 B2 | 11/2010 | Chidambarrao et al. |
| 7,919,988 B2 | 4/2011 | Oh |
| 2009/0058510 A1 | 3/2009 | Park |
| 2010/0182729 A1 | 7/2010 | Wang et al. |
| 2013/0099853 A1 | 4/2013 | Yang et al. |

OTHER PUBLICATIONS

Guarin et al. A Practical Approach for the Accurate Lifetime Estimation of Device Degradation in Deep Sub-Micron CMOS Technologies. Fourth IEEE International Caracas Conference on Devices, Circuits and Systems, Aruba, Apr. 17-19, 2002, pp. 1-8.

Rieh et al. SiGe Heterojunction Bipolar Transistors and Circuits Toward Terahertz Communication Applications. IEEE Transactions on Microwave Theory and Techniques. vol. 52, No. 10, Oct. 2004, pp. 2390-2408.

List of IBM Patents or Patent Applications Treated as Related (Appendix P), 2014.

FIG. 10

METHODOLOGY AND APPARATUS FOR TUNING DRIVING CURRENT OF SEMICONDUCTOR TRANSISTORS

CROSS REFERENCE TO RELATED APPLICATIONS

The present application is a divisional of and claims priority under 35 U.S.C. §121 of U.S. patent application Ser. No. 13/280,666, filed on Oct. 25, 2011, which is incorporated by reference in its entirety.

FIELD OF THE INVENTION

The present invention relates to methodologies and apparatus for repairing PFET and NFET transistors due to degradation from extended use.

BACKGROUND

As semiconductor technology advances, certain device wear-out mechanisms have become more and more prominent, which the inventors believe may start to severely impact the stability and functionality of product circuits within their specified lifetime. Semiconductors are increasingly built utilizing high-κ dielectrics to allow for faster speeds and smaller sizes. The term high-κ dielectric refers to a material with a high dielectric constant κ (as compared to silicon dioxide) used in semiconductor manufacturing processes which replaces the silicon dioxide gate dielectric. The implementation of high-κ gate dielectrics is one of several strategies developed to allow further increase in device speed and miniaturization of microelectronic components, colloquially referred to as extending Moore's Law. Silicon dioxide has been used as a gate oxide material for decades. As transistors have decreased in size, the thickness of the silicon dioxide gate dielectric has steadily decreased to increase the gate capacitance and thereby drive current and device performance. As the thickness scales below 2 nm, leakage currents due to tunneling increase drastically, leading to unwieldy power consumption and reduced device reliability. Replacing the silicon dioxide gate dielectric with a high-κ material allows increased gate capacitance without the concomitant leakage effects.

The inventors have noted that during the operation of a NFET (Negative Channel Field Effect Transistor) with a high-κ material, electrons migrate towards the gate oxide and tend to reduce the operation of the transistor. As stated above due to the decrease in the thickness and overall size of the components on a silicon dioxide chip, the effect of electrons trapped in the transistor gate dielectric is significantly increased.

In a similar manner the inventors have identified that during the operation of a PFET (Positive Channel Field Effect Transistor) with a high-κ material, holes tend to build up in the gate oxide. Again due to the decrease in the thickness and overall size of the components on a silicon dioxide chip, the effect of the holes trapped in transistor gate dielectric is significantly increased.

Due to detrimental affects of the build up of electrons in NFETs and holes in PFETs in their gate dielectrics, the inventors have determined that a method and apparatus for repairing or tuning transistors would be desirable.

SUMMARY

One embodiment of the present invention is a method for repairing a transistor which comprises the steps of applying a first voltage to a source of a PFET, a second voltage to the gate of a PFET and a third voltage to the drain of a PFET for a predetermined time. Wherein the first voltage is greater than the second voltage and the second voltage is greater than the third voltage. By applying these voltages the inventors have determined that the holes trapped inside the gate dielectric will be reduced. In this manner the inventors have determined that the semiconductor structure may be repaired or returned to at or near the original operating characteristics.

In a further embodiment the first voltage is a supply voltage such as Vdd and the third voltage is a ground. In yet another embodiment the first voltage is greater than a supply voltage. In yet another embodiment the second voltage is less than the supply voltage when the first voltage is greater than the supply voltage.

An additional embodiment is a method for repairing a transistor which comprises, applying a first voltage to a drain of a NFET a second voltage to the gate of the NFET and a third voltage to the source of an NFET a predetermined time. The first voltage is greater than the second voltage and the second voltage is greater than the third voltage. As was illustrated in the first embodiment the objective of the invention is to repair the transistor. In the case of the NFET the electrons during normal operation build up on the gate dielectric, The inventors have determined that by applying the voltages in the manner described the transistor may be repaired to operate at or near the original specifications.

In a further embodiment for the repair of an NFET the first voltage is a supply voltage and the third voltage is a ground. In a further embodiment, the first voltage is greater than a supply voltage. In a further embodiment the second voltage is less than the supply voltage when the first voltage is greater than the supply voltage.

An additional embodiment comprises an apparatus for repairing a PFET comprising a first switch adapted to connect a first voltage to the source of the PFET. A second switch is adapted to connected to a second voltage to the gate of the PFET and a third switch is adapted to connect a third voltage to the drain of the PFET. The first, second and third switch are closed for a predetermined time and the first voltage is greater than the second voltage and the second voltage is greater than the third voltage. The apparatus described above operates to implement the method described above for the repair of a PFET.

In a further embodiment the apparatus above has the first voltage as a supply voltage and the third voltage as a ground. In an additional embodiment the first voltage is greater than a supply voltage. In a further embodiment the second voltage is less than the supply voltage.

An additional embodiment comprises an apparatus for repairing a NFET which has a first switch adapted to connect a first voltage to the drain of the NFET. A second switch is adapted to connect a second voltage to the gate, and a third switch is adapted to connect a third voltage to the source of the NFET. The first, second and third switch are closed for a predetermined time and the first voltage is greater than the second voltage and the second voltage is greater than the third voltage. The apparatus is able to implement the method described above for the repair of an NFET.

In an additional embodiment the first voltage is a supply voltage and the third voltage is a ground. In a further embodiment the first voltage is greater than a supply voltage. In an additional embodiment the second voltage is less than the supply voltage.

An additional embodiment comprises a method for repairing a plurality of transistors by applying a first voltage to the sources of a plurality of PFET transistors a second voltage to the gate of a plurality of PFET transistors and a third voltage to the drains of a plurality of PFET transistors a for a first predetermined time. Wherein the first voltage is greater than the second voltage and the second voltage is greater than the third voltage.

An additional embodiment of the invention comprises an apparatus for repairing a plurality of PFET transistors comprising a first switch adapted to connect a first voltage to the source of a plurality of PFET transistors. A second switch is adapted to connected to a second voltage to the gate of a plurality of PFET transistors and a third switch is adapted to connect a third voltage to the drain of a plurality of PFET transistors. The first, second and third switch are closed for a predetermined time and the first voltage is greater than the second voltage and the second voltage is greater than the third voltage.

An additional embodiment comprises a method for repairing a plurality of NFET transistors by applying a first voltage to the drains of the plurality of NFET transistors, a second voltage to the gates of a plurality of NFET transistors and third voltage to the sources of a plurality of NFET transistors for a first predetermined time. Wherein the first voltage is greater than the second voltage and the second voltage is greater than the third voltage.

An additional embodiment comprises an apparatus for repairing a plurality of NFET transistors which has a first switch adapted to connect a first voltage to the drain of a plurality of NFET transistors. A second switch is adapted to connect a second voltage to the gates of a plurality of NFET transistors, and a third switch is adapted to connect a third voltage to the source of a plurality of NFET transistors. The first, second and third switch are closed for a predetermined time and the first voltage is greater than the second voltage and the second voltage is greater than the third voltage.

DETAILED DESCRIPTION

Figure 1:
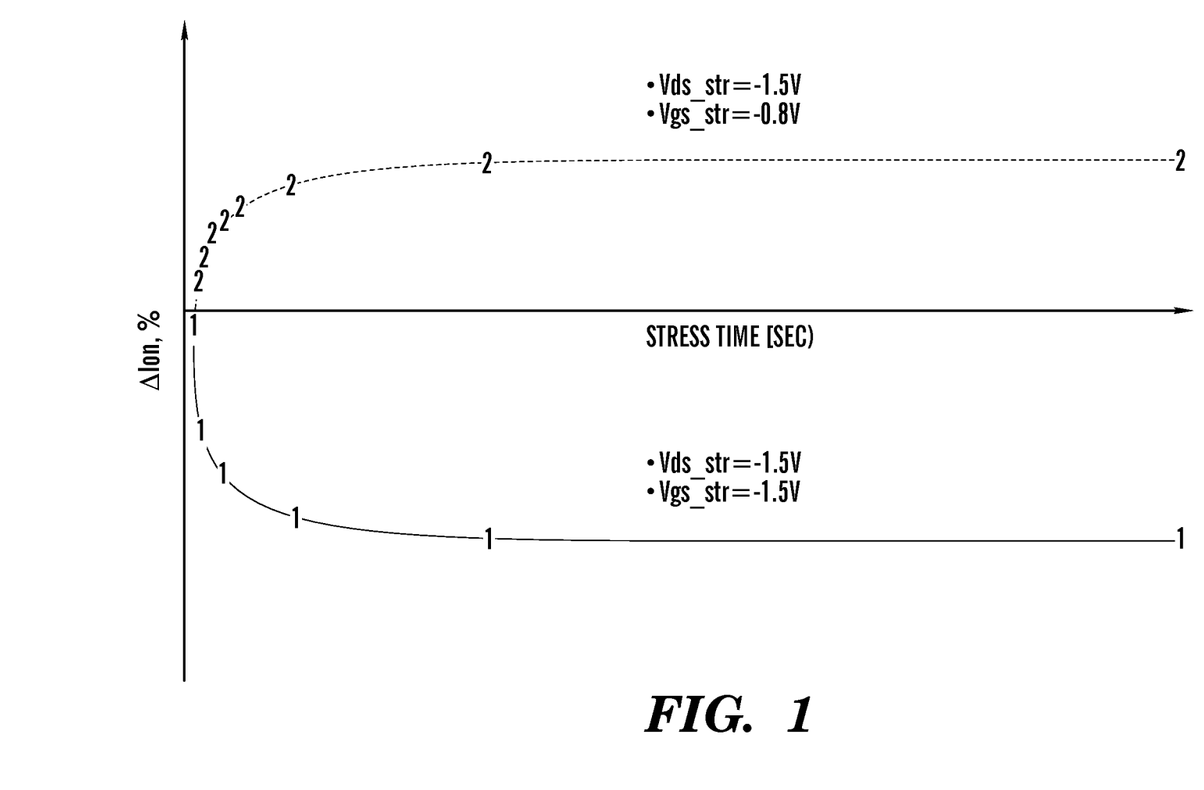
FIG. 1 illustrates the Ion shift in a PFET under two different voltage loads.

As shown in FIG. 1, when a fresh PFET device was stressed at an elevated gate voltage (Vgs_str) similar to the drain voltage (Vds_str), such as Vgs_str=Vds_str in this case, the Ion value degrades and shifts lower and is consistent with prior art observations. However, the Ion value shifts higher when a degraded PFET device was stressed under lower gate voltage at around half of the drain voltage, or Vgs_str~(1/2× Vds_str). Furthermore, the shifting of the Ion value can be tuned high-to-low or low-to-high by adjusting stressing voltage biases.

Figure 2:
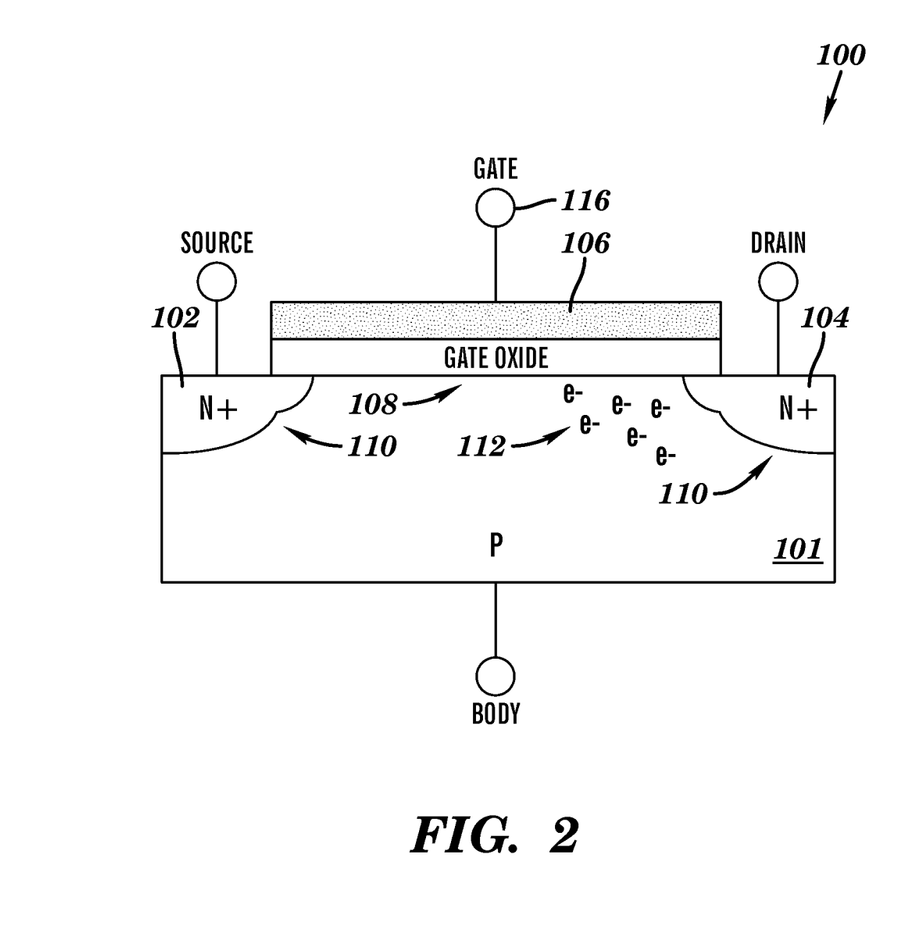
FIG. 2 is a block diagram of a metal oxide semiconductor negative channel field effect transistor (NFET).

FIG. 2 is a block diagram of a metal oxide semiconductor negative channel field effect transistor (NFET) 100. FIG. 2 is useful in illustrating the conventional operation of a NFET such as can be used in a DRAM array. FIG. 2 illustrates the normal hot electron injection and degradation of devices operated in the forward direction. As is explained below, since the electrons 112 are trapped near the drain 104 the transistor 100 is less effective in changing the device characteristics. The NFET 100 includes a source region 102, a drain region 104, a gate region 106, a channel region 108 in the substrate 101 between a source region 102 and a drain region 104 under a gate 106.

Before this recent discovery by the inventors, it is widely accepted that the wear-out mechanism can only decrease the device current (Ion). For example, U.S. Pat. No. 6,388,494 entitled "Offset Trim Using Hot-electron Induced VT-shifts," teaches a bias tuning method to compensate for the device degradation. As we recently observed that the device current (Ion) can be tuned to either higher or lower values, it can now be contemplated that the performance and functionality of a FET (Field Effect Transistor) devices can be fine tuned in the field to maintain optimum circuit performance. This is very crucial in the nano-scale semiconductor devices due to the large variation in intrinsic device parameters (e.g. Ion and Vth). Any matching FET devices or circuits can potentially benefit from this current tuning concept. In addition, this invention can also be applied to circuit reliability or long-term stability, since the degraded FET device parameters can now be recovered (i.e. repaired) in the field by a built-in circuit and repair instruction. Therefore, optimum performance and functionality of product circuits associated with FET devices can be maintained to extend product lifetime (i.e. robust reliability).

As described previously, device current shifting is detrimental to the long-term stability of any product circuit, regardless of the shift direction. For example, in a typical analog circuit the FET device is always biased at one pre-set point (such as Vgs=Vds), which dictates the long-term current shifting of this device and may eventually lead to circuit failure. As the inventors recently observed, the device current can be shifted either higher or lower by a specific accelerated bias condition. With Vdd defined as the supply voltage, the device driving current can be tuned by the following conditions as examples. Note that the exact bias conditions can be pre-determined by semiconductor manufacturers for product implementation.

In conventional operation, a drain to supply voltage potential (Vds) is set up between the drain region 104 and source region 102. A voltage potential is then applied to the gate 106 via a wordline 116. Once the voltage potential applied to the gate 106 surpasses the characteristic voltage threshold (Vth) of the FET a channel 108 forms in the substrate 101.

For example, channel hot-carrier (CHC) is one of the major reliability degradation mechanisms in FET devices. Traditionally, under device operation condition, charge carriers (i.e. electrons for NFET devices and holes for PFET devices) with excessive energy may be injected into the silicon/oxide interface in the channel region, causing decrease in carrier mobility and thus decrease in the driving current (or Ion) when the devices are turned on. This Ion degradation also translates to increase in the device threshold voltage (or Vth), making it harder to turn on the degraded devices.

As the complexity in device structure and fabrication process significantly increases in recent technologies, such as in 32 nm node and beyond, certain device wear-out mechanisms also start to show behavior that is unexpected from convention wisdom. One example is the CHC mechanism associated with PFET devices, where the inventors recently observed experimentally that the Ion and Vth values can either decrease or increase by accelerated voltage stress, depending on the specific stress voltage bias, as illustrated in FIG. 1.

Figure 3:
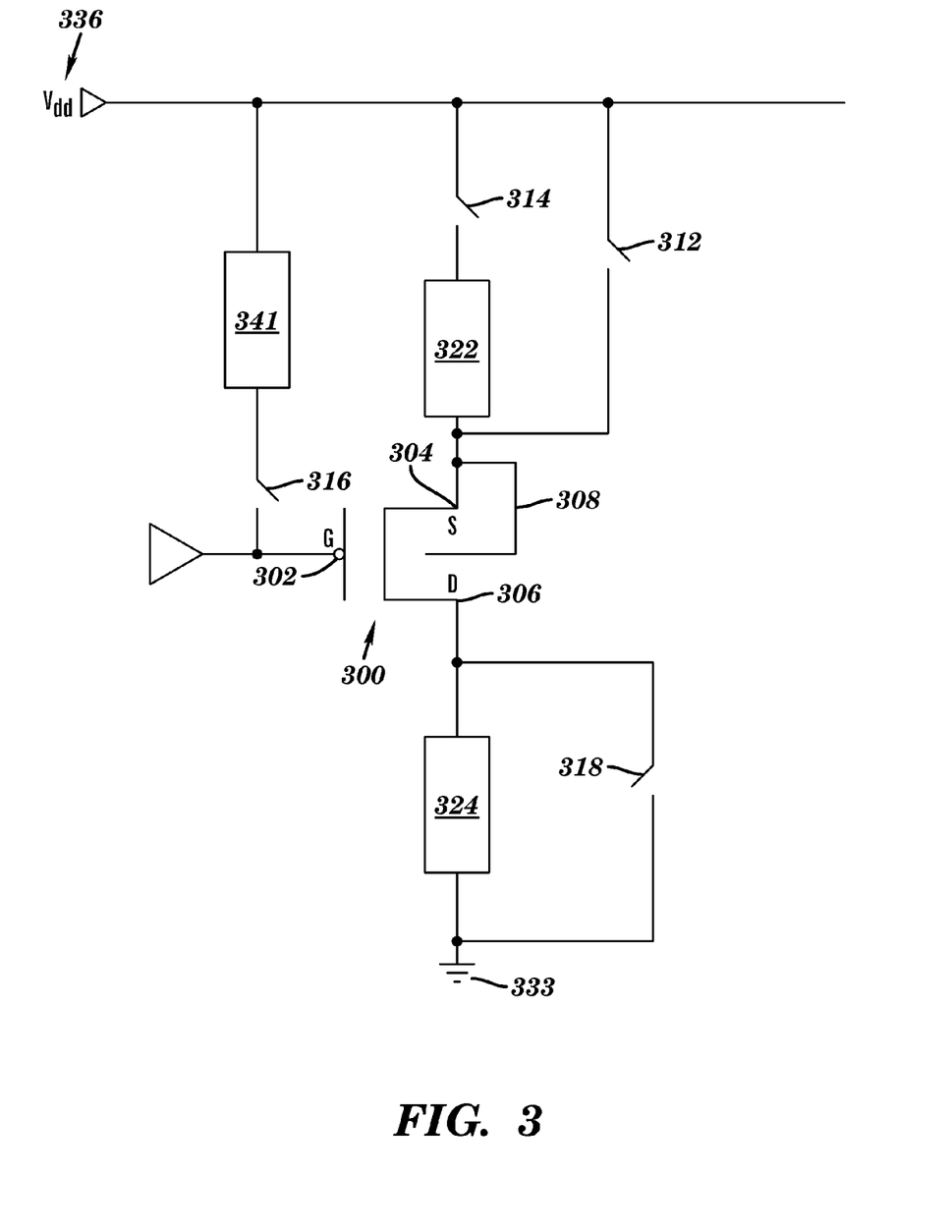
FIG. 3 illustrates an embodiment of an apparatus to repair or tune a PFET.

FIG. 3 illustrates one embodiment of apparatus to repair or tune a PFET. PFET 300 comprises a gate 302, a source 304, a drain 306 and a body 308. During normal operation switches 312, 316 and 318 remain open and switch 314 remains closed. Pull up block 322 is connected to switch 314 which when closed connects pull up block 322 to voltage source Vdd 336. The other end of the pull up block 322 is connected to source 304. Pull up block 322 is a resistive element comprising, for example, a single device or a function circuit, which connects to the supply voltage Vdd 336 at one end and source 304 of the PFET 300 at the other end. A pull down block 324 is connected between drain 306 and ground 333. Pull down block 324 is a resistive element comprising, for example, a single device or a function circuit, which connects to ground 333 at one end and drain 306 of the PFET 300 at the other end. A voltage regulator module 341 is placed between Vdd 336 and switch 316. Switch 312 is connected between Vdd 336 and the source 304 of PFET 300. Switch 318 is connected between drain 306 and ground 333.

During normal operation switches 316, 312, and 318 are open and switch 314 is closed. During normal operation current is decreased causing degradation as holes to build up in the gate oxide of PFET 300. In the repair mode switch 314 is open and switches 316, 312, and 318 are closed. During normal operation the voltage across the drain and the source, Vds is equal to Vdd. The voltage from the gate to the source, Vgs is between 0 and Vdd 336. During the repair mode the voltage across the drain and source, Vds, is equal to Vdd since source 304 is connected to Vdd 336 via switch 312 and drain 306 is connected to ground 333 via switch 318. The voltage from the gate to the source, Vgs, is biased between zero and the voltage threshold (or Vth, which for example equals to about −300 millivolt) of PFET 300 by the voltage regulator module 341. During the repair mode the current is increased and repairs the degraded device.

Figure 4:
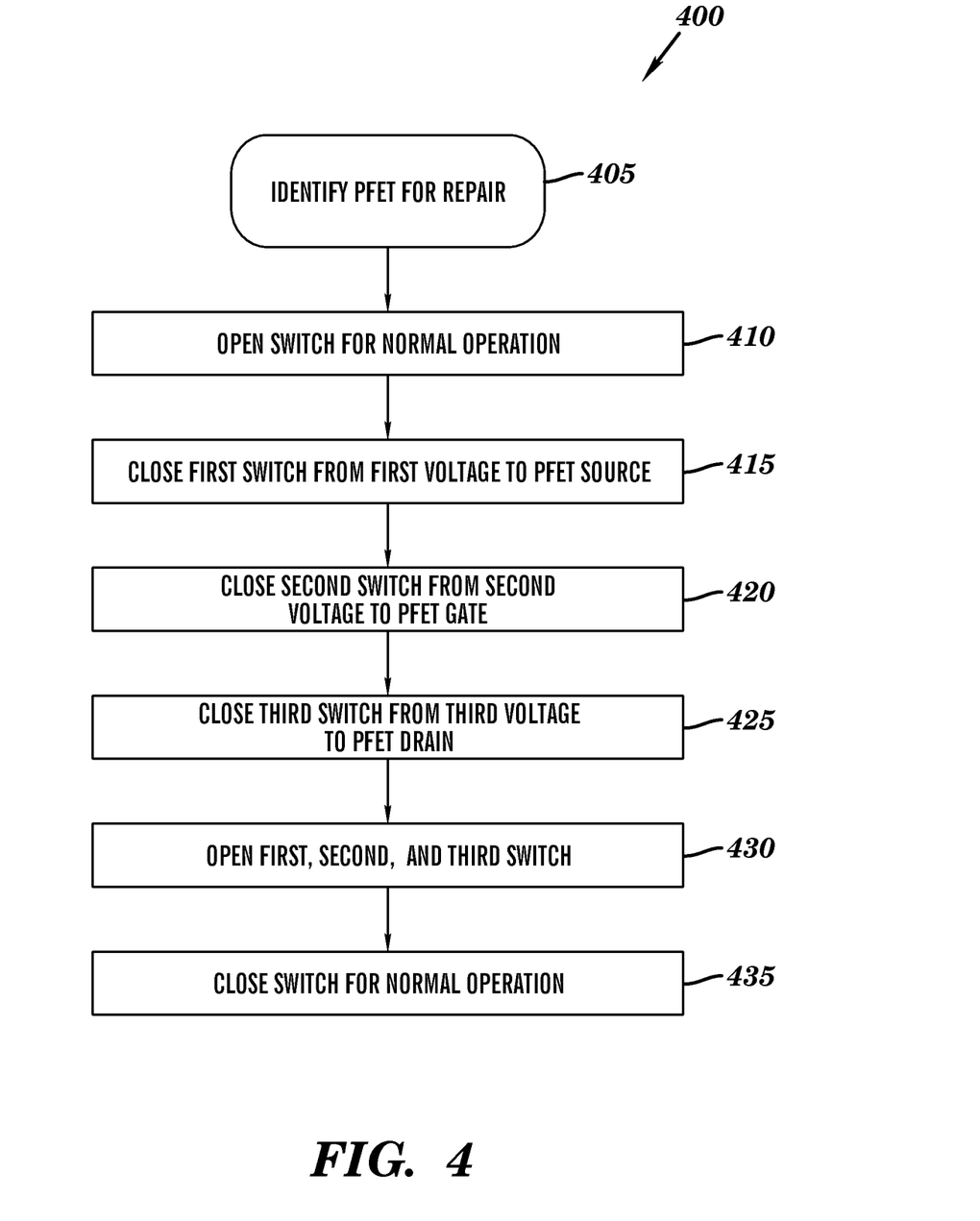
FIG. 4 is a flow chart of a method for repairing a PFET.

FIG. 4 is a flow chart of a method for repairing a PFET. The flow chart illustrates how the apparatus of FIG. 3 may be operated to invoke the repair of PFET 300. Step 405 may be to identify a PFET in need of repair. Step 410 may be to open switch 314 of FIG. 3 to stop normal operation of the PFET. Step 415 is to close switch 312, step 420 is to close switch 316 and step 425 is to close switch 318 of FIG. 3. These switches are closed for a predetermined time while the PFET is repaired or tuned. The predetermined time may be determined based upon the voltages available, the materials and the performance desired.

Figure 5:
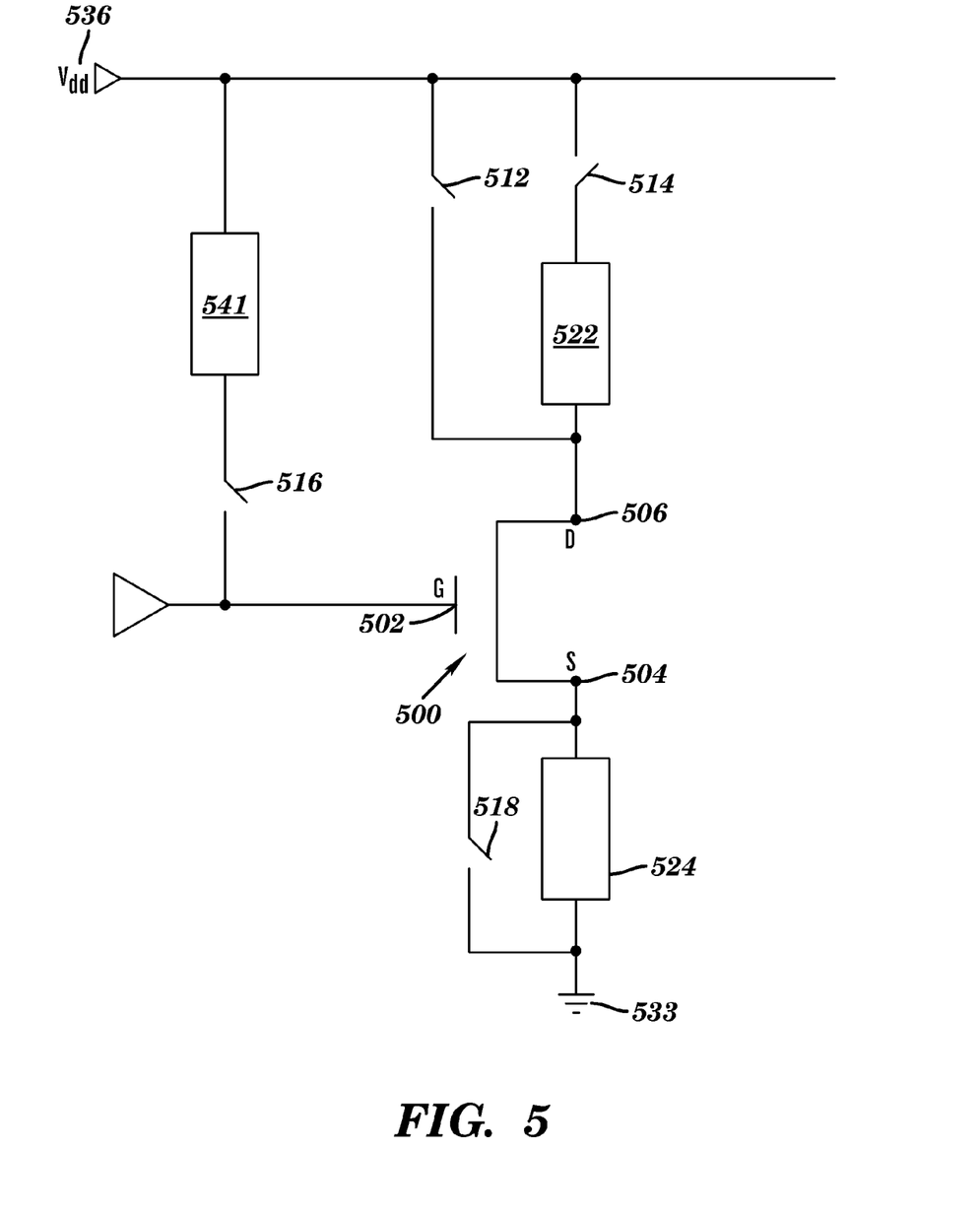
FIG. 5 illustrates an embodiment of an apparatus to repair or tune an NFET.

FIG. 5 illustrates an embodiment of an apparatus to repair or tune an NFET. NFET 500 comprises a gate 502, a source 504, and a drain 506. During normal operation switches 512, 516 and 518 remain open and switch 514 remains closed. Pull up block 522 is connected to switch 514 which when closed connects pull up block 522 to voltage source Vdd 536. The other end of the pull up block 522 is connected to drain 506. Note that pull up block 522 is a resistive element comprising, for example, a single device or a function circuit, which connects to the supply voltage Vdd 536 at one end and drain 506 of the NFET 500 at the other end. A pull down block 524 is connected between source 504 and ground 533. Note that pull down block 524 is a resistive element comprising, for example, a single device or a function circuit, which connects to ground 533 at one end and source 504 of the NFET 500 at the other end. A voltage regulator 541 is placed between Vdd 536 and switch 516. Switch 512 is connected between Vdd 536 and the drain 506 of NFET 500. Switch 518 is connected between source 504 and ground 533.

During normal operation switches 516, 512, and 518 are open and switch 514 is closed. During normal operation current is decreased causing degradation as electrons to build up in the gate oxide of NFET 500. In the repair mode switch 514 is open and switches 516, 512, and 518 are closed. During normal operation the voltage across the drain and the source, Vds is equal to Vdd. The voltage from the gate to the source, Vgs is between 0 and Vdd 536. During the repair mode the voltage across the drain and source, Vds, is equal to Vdd since drain 506 is connected to Vdd 536 via switch 512 and source 504 is connected to ground 533 via switch 518. The voltage from the gate to the source, Vgs, is biased between zero and the voltage threshold (or Vth, which for example equals to about 300 millivolt) of NFET 500 by the voltage regulator module 541. During the repair mode the current is increased and repairs the degraded device. Please be noted that the source and drain notes of NEFT (FIG. 5) and PFET (FIG. 3) are in opposite positions.

Figure 6:
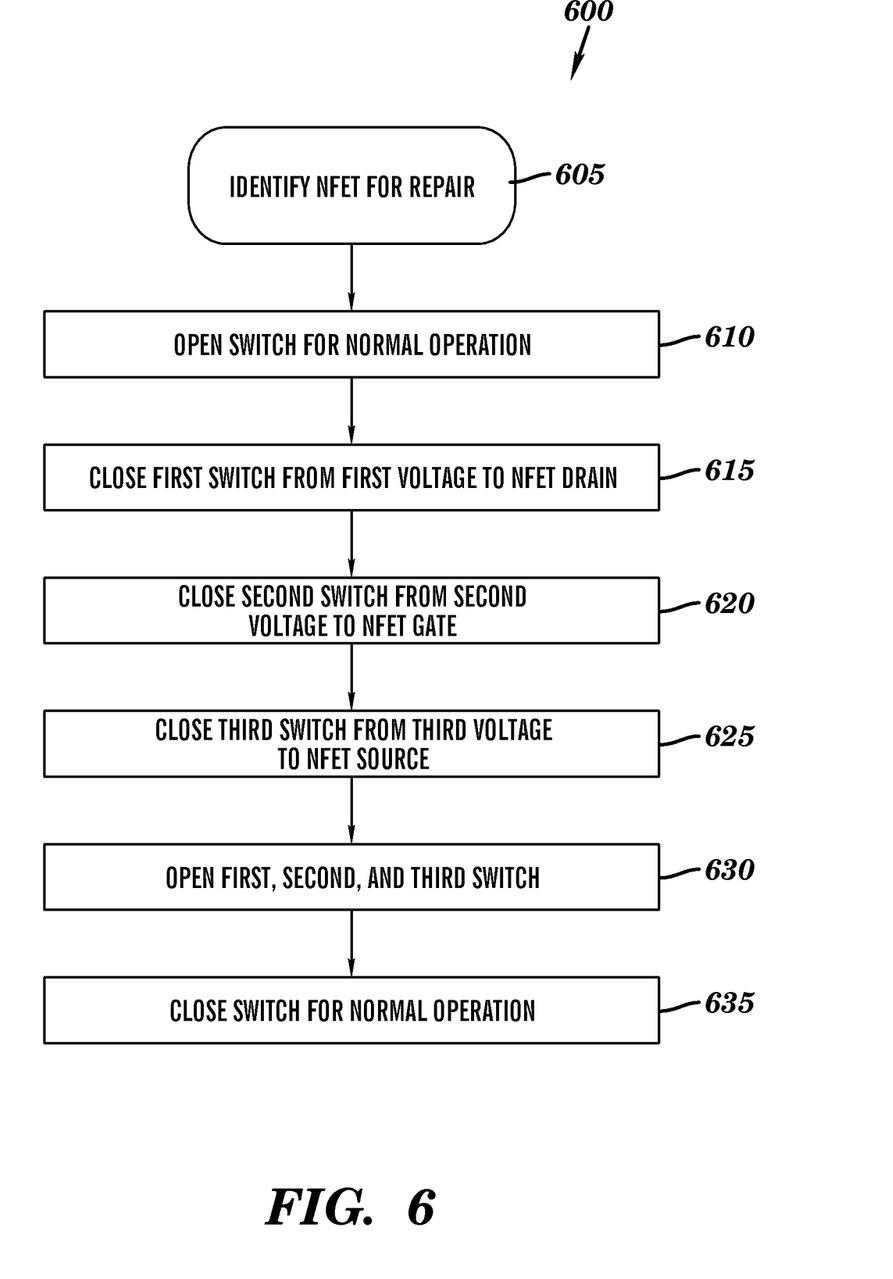
FIG. 6 is a flow chart of a method for repairing an NFET.

FIG. 6 is a flow chart of a method for repairing an NFET. The flow chart illustrates how the apparatus of FIG. 5 may be operated to invoke the repair of NFET 500. Step 605 may be to identify an NFET in need of repair. Step 610 may be to open switch 514 of FIG. 5 to stop normal operation of the NFET. Step 615 is to close switch 512, step 620 is to close switch 516 and step 625 is to close switch 518 of FIG. 5. These switches are closed for a predetermined time while the NFET is repaired or tuned. The predetermined time may be determined based upon the voltages available, the materials and the performance desired.

Figure 7:
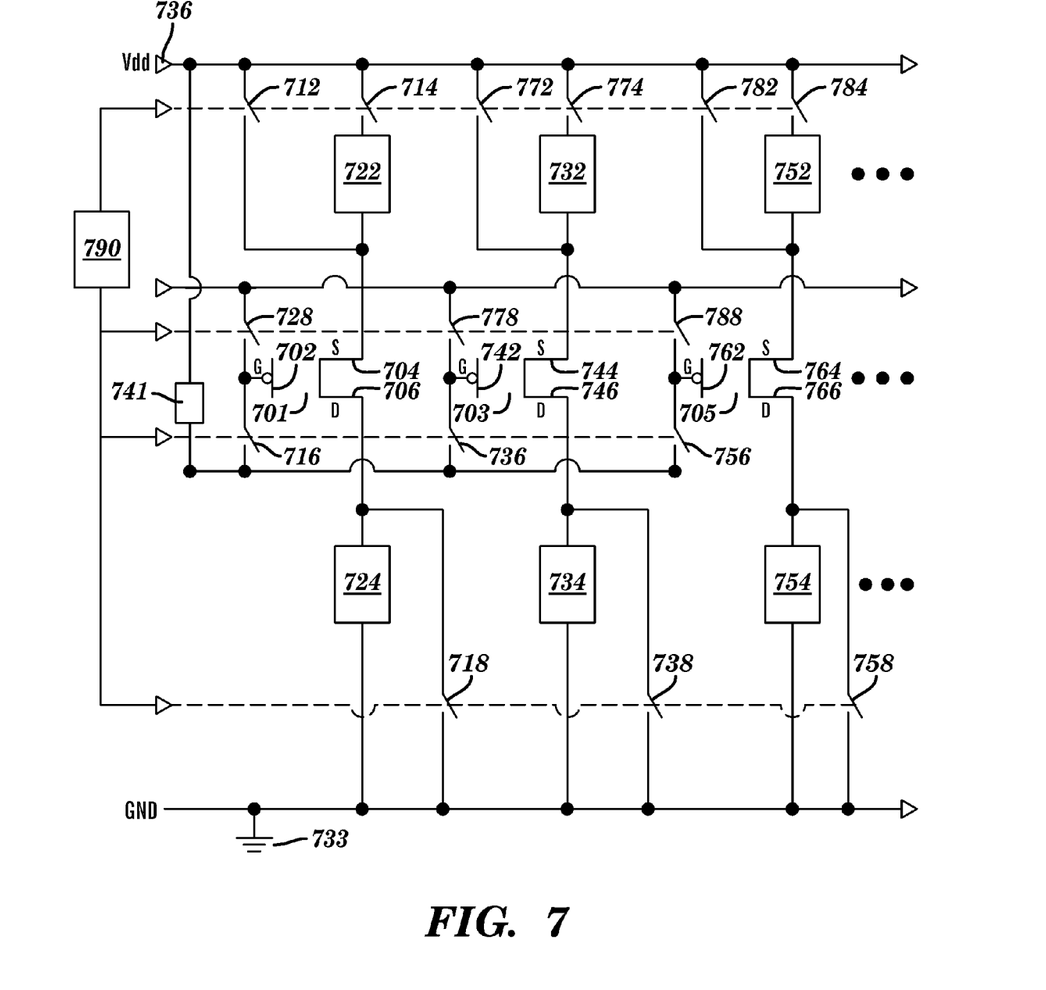
FIG. 7 illustrates an embodiment of an apparatus to repair a plurality of PFETs.

FIG. 7 illustrates an embodiment of an apparatus to repair or tune a plurality of PFETs. FIG. 7 illustrates three PFETS, however it should be clear from the illustration that additional PFETs may be added to the circuitry. PFETs 701, 703, 705 comprise gates 702, 742, and 762, sources 704, 744, 764, and drains 706, 746, 766. In order to control the switches as was done in FIG. 3 a logic controller 790 has been incorporated to control the switches. During normal operation switches 712, 772, 782, 716, 736, 756, 718, 738 and 758 remain open and switch 714, 728, 774, 778, 784, and 788 remain closed. Pull up block 722 is connected to switch 714 which when closed connects pull up block 722 to voltage source Vdd 736. The other end of the pull up block 722 is connected to source 704. Pull up block 722 is a resistive element comprising, for example, a single device or a function circuit, which connects to the supply voltage Vdd 736 at one end and source 704 of the PFET 701 at the other end. A pull down block 724 is connected between drain 706 and ground 733. Pull down block 724 is a resistive element comprising, for example, a single device or a function circuit, which connects to ground 733 at one end and drain 706 of the PFET 701 at the other end. A voltage regulator module 741 is placed between Vdd 736 and switch 716. Switch 712 is connected between Vdd 736 and the source 704 of PFET 701. Switch 718 is connected between drain 706 and ground 733.

During normal operation switches 716, 712, and 718 are open and switch 714 is closed. During normal operation current is decreased causing degradation as holes to build up in the gate oxide of PFET 701. In the repair mode switch 714 and 728 are open and switches 716, 712, and 718 are closed. During normal operation the voltage across the drain and the source, Vds is equal to Vdd. The voltage from the gate to the source, Vgs is between 0 and Vdd 736. During the repair mode the voltage across the drain and source, Vds, is equal to Vdd since source 704 is connected to Vdd 736 via switch 712 and drain 706 is connected to ground 733 via switch 718. The voltage from the gate to the source, Vgs, is biased between zero and the threshold voltage (or Vth, which for example equals to about −300 millivolt) of PFET 701 by the voltage regulator module 741. During the repair mode the current is increased and repairs the degraded device.

The repair or tuning of transistors 703 and 705 may operate in the same manner as the tuning of transistor 701. The logic circuit 790 may open or close switches in a similar manner such that individual transistors are tuned or repaired or an entire series of transistors are tuned or repaired at the same time.

Figure 8:
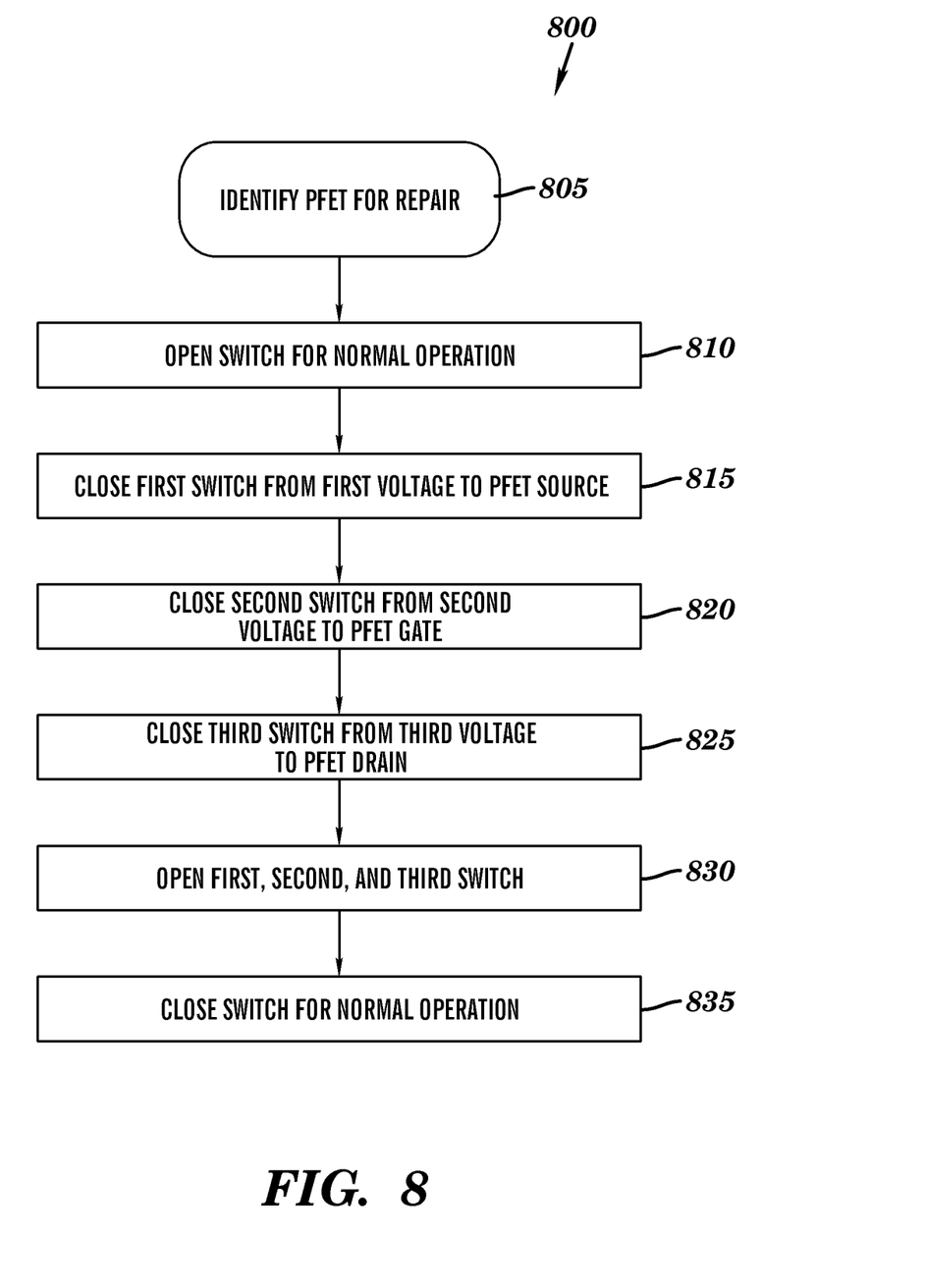
FIG. 8 is a flow chart of a method for repairing a plurality of PFETs.

FIG. 8 is a flow chart of a method for repairing a plurality of PFETs. The flow chart illustrates how the apparatus of FIG. 7 may be operated to invoke the repair of PFETs 701, 703, and 705. Step 805 may be to identify the PFETs in need of repair. Step 810 may be to open switch 714, 774, and 784 of FIG. 7 to stop normal operation of the PFET. Step 815 is to close switch 712, 772 and 782 of FIG. 7. Step 820 is to close switch 716, 736, and 756 of FIG. 7 and step 825 is to close switch 718, 738 and 758 of FIG. 7. These switches are closed for a predetermined time while the PFETs are repaired or tuned. The predetermined time may be determined based upon the voltages available, the materials and the performance desired. Step 830 is to open the switches previously closed and step 835 is to close the switches previously opened.

Figure 9:
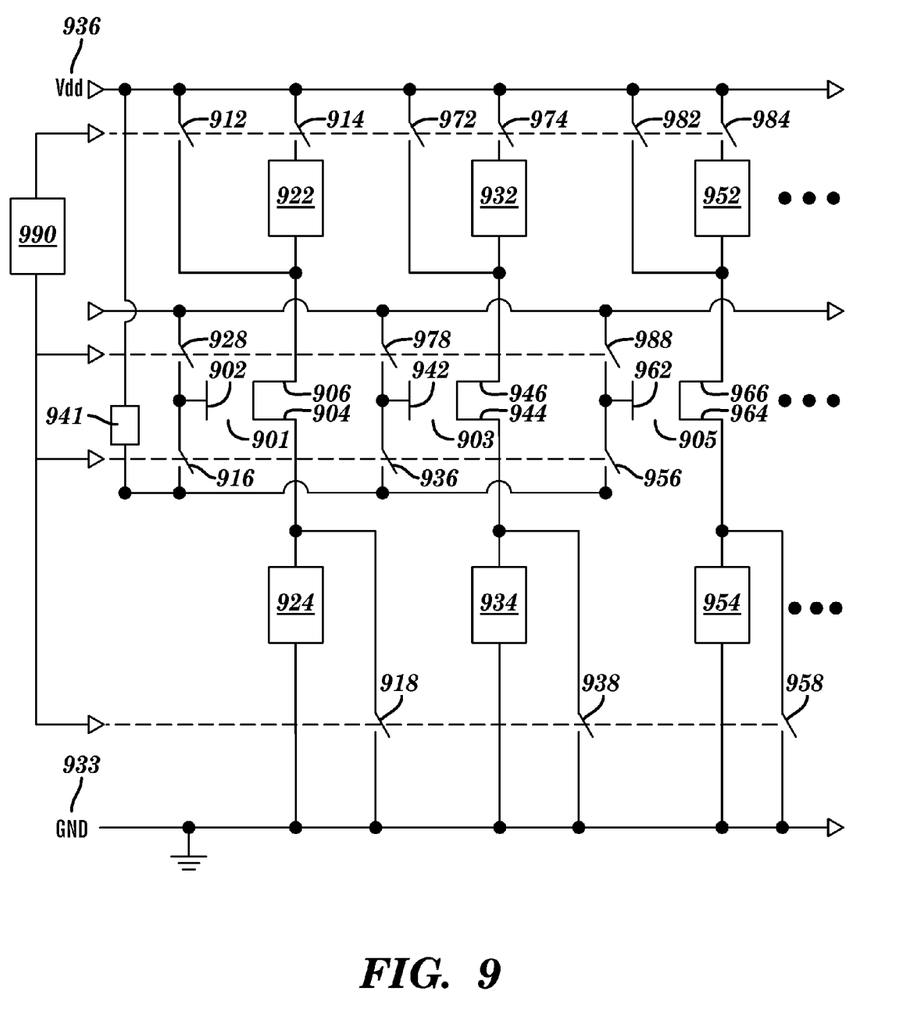
FIG. 9 illustrates an embodiment of an apparatus to repair a plurality of NFETs.

FIG. 9 illustrates an embodiment of an apparatus to repair a plurality of NFETs. The NFET's comprises gates 902, 942, 962, sources 904, 944, and 964 and drains 906, 946, and 966. During normal operation switches 912, 972, 982, 916, 936, 956, 918, 938, and 958 remain open and switches 914, 974, 984, 928, 978 and 988 remain closed. Pull up blocks 922, 932, and 952 are connected to switches 914, 974 and 984 respectively, which when closed connect pull up blocks 922, 932, and 952 to voltage source Vdd 936. The other end of the pull up block 922, 932 and 952 are connected to drain 906, 946, and 966 respectively. Note that pull up blocks 922, 932 and 952 are resistive elements comprising, for example, a single device or a function circuit. Pull down block 924, 934, and 954 are connected between source 904, 944 and 964 respectively and ground 933. Note that pull down blocks 924, 934, and 954 are resistive elements comprising, for example, a single device or a function circuit. A voltage regulator 941 is placed between Vdd 936 and switches 916, 936, and 956. Switches 912, 972 and 982 are connected between Vdd 936 and the drains 906, 946, and 966. Switch 918, 938, and 958 are connected between source 904, 944, 964 respectively and ground 933. In order to control the switches as was done in FIG. 5 a logic controller 990 has been incorporated to control the switches.

During normal operation switches 912, 972, 982, 916, 936, 956, 918, 938 and 958 are open and switches 914, 974, 984, 928, 978 and 988 are closed. During normal operation current is decreased causing degradation as electrons build up in the gate oxide of NFETs. In the repair mode switches 914, 974, 984, 928, 978 and 988 are open and switches 912, 972, 982, 916, 936, 956, 918, 938 and 958 are closed. During normal operation the voltage across the drains and the sources, Vds are equal to Vdd. The voltage from the gates to the sources, Vgs is between 0 and Vdd 936. During the repair mode the voltage across the drain and source, Vds, is equal to Vdd since drains 906, 946 and 966 are connected to Vdd 936 via switches 912, 972, 982 are respectively and sources 904, 944 and 964 are connected to ground 933 via switch 918, 938 and 958 respectively. The voltage from the gate to the source, Vgs, is biased between zero and device threshold voltage (or Vth, which for example equals to about 300 millivolt) of the NFETs by the voltage regulator module 941. During the repair mode the current is increased and repairs the degraded device. Please be noted that the source and drain notes of NEFT (FIG. 9) and PFET (FIG. 3) are in opposite positions.

Figure 10:
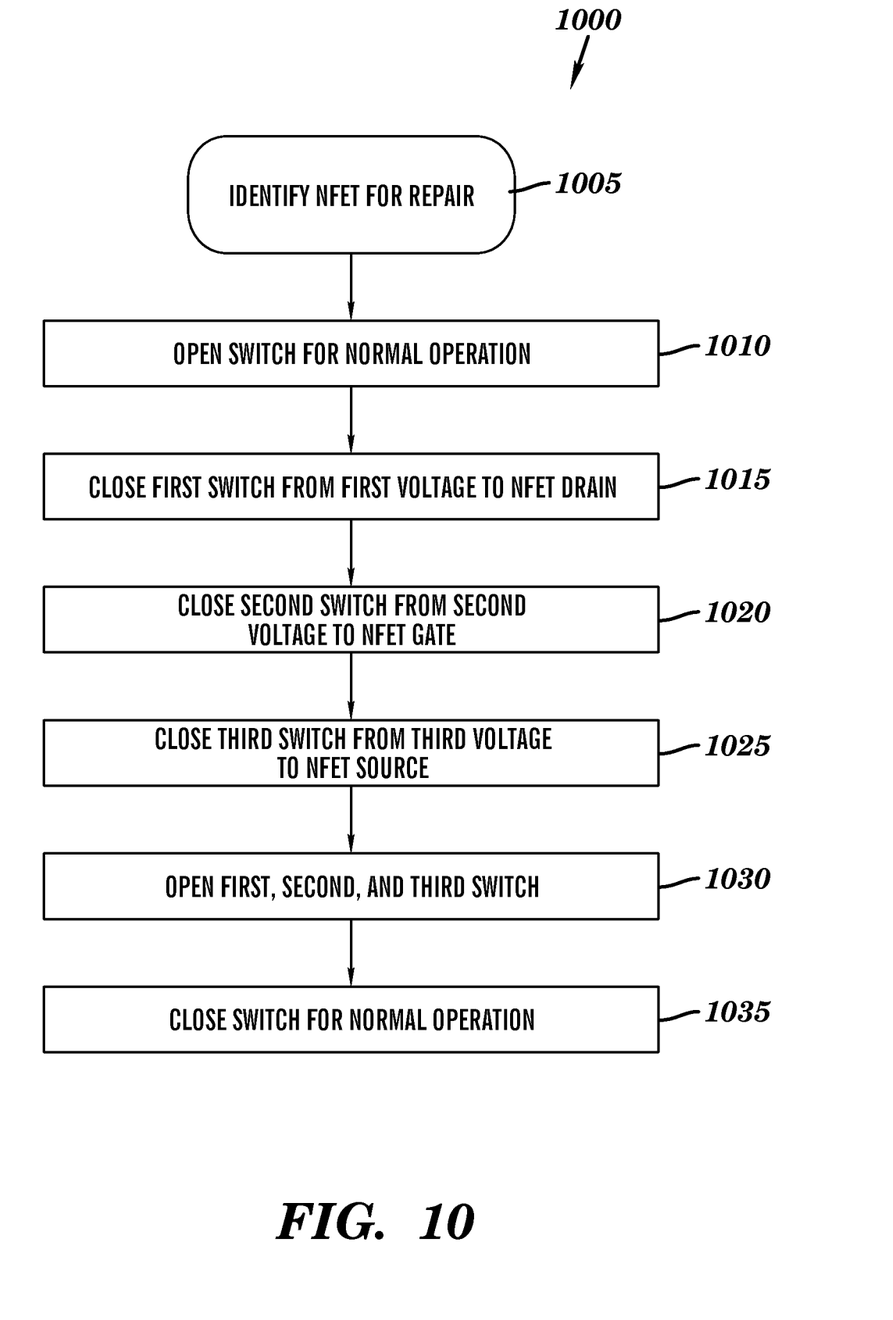
FIG. 10 is a flow chart of a method for repairing a plurality of NFETs.

FIG. 10 is a flow chart of a method for repairing a plurality of NFETs The flow chart illustrates how the apparatus of FIG. 9 may be operated to invoke the repair of NFETs 901, 903, and 905. Step 1005 may be to identify the NFETs in need of repair. Step 1010 may be to open switch 914, 974, and 984 of FIG. 9 to stop normal operation of the NFET. Step 1015 is to close switch 912, 972, and 982 of FIG. 9. Step 1020 is to close switch 916, 936, and 956 of FIG. 9 and step 1025 is to close switch 918, 938 and 958 of FIG. 9. These switches are closed for a predetermined time while the NFETs are repaired or tuned. The predetermined time may be determined based upon the voltages available, the materials and the performance desired. Step 1030 is to open the switches previously closed and step 1035 is to close the switches previously opened.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for repairing a channel region between a source and drain of a NFET comprising:
    applying a first voltage to the drain of the NFET for a first predetermined time;
    applying a second voltage to a gate of the NFET for the first predetermined time; and
    applying a third voltage to the source of the NFET for the first predetermined time,
    wherein the first voltage is greater than the second voltage, and the second voltage is greater than the third voltage, and wherein the second voltage and the gate-to-source voltage of the NFET are each maintained at a decreased voltage level during the first predetermined time compared to a voltage level of the same prior to entering a repair mode for the first predetermined time to repair the channel region of the NFET.

2. The method of claim 1, wherein the first voltage is a supply voltage and the third voltage is a ground.

3. The method of claim 1, wherein the first voltage is greater than a supply voltage.

4. The method of claim 3, wherein the second voltage is less than the supply voltage.

5. An apparatus for repairing a channel region between a source and drain of a NFET comprising:
   a first switch adapted to connect a first voltage to the drain of the NFET;
   a second switch adapted to connect a second voltage to a gate of the NFET; and
   a third switch adapted to connect a third voltage to the source of the NFET,
   wherein the first, second, and third switches are closed for a predetermined time,
   wherein the first voltage is greater than the second voltage and the second voltage is greater than the third voltage, and wherein the second voltage and the gate-to-source voltage of the NFET are each maintained at a decreased voltage level during the predetermined time compared to a voltage level of the same prior to entering a repair mode for the predetermined time to repair the channel region of the NFET.

6. The apparatus of claim 5, wherein the first voltage is a supply voltage and the third voltage is a ground.

7. The apparatus of claim 5, wherein the first voltage is greater than a supply voltage.

8. The apparatus of claim 7, wherein the second voltage is less than the supply voltage.

9. A method for repairing a channel region between sources and drains in a plurality of NFET transistors comprising:
   applying a first voltage to the drains of the plurality of NFET transistors for a first predetermined time;
   applying a second voltage to gates of the plurality of NFET transistors for the first predetermined time; and
   applying a third voltage to the sources of the plurality of NFET transistors for the first predetermined time,
   wherein the first voltage is greater than the second voltage and the second voltage is greater than the third voltage, and wherein the second voltage and the gate-to-source voltages of the NFET transistors are each maintained at a decreased voltage level during the first predetermined time compared to a voltage level of the same prior to entering a repair mode for the first predetermined time to repair the channel regions of the plurality of NFET transistors.

\* \* \* \* \*